(12) United States Patent
Li

(10) Patent No.: US 7,425,503 B1
(45) Date of Patent: Sep. 16, 2008

(54) APPARATUS AND METHOD FOR ENHANCED THERMAL CONDUCTIVITY PACKAGES FOR HIGH POWERED SEMICONDUCTOR DEVICES

(75) Inventor: Felix C. Li, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/486,801

(22) Filed: Jul. 14, 2006

Related U.S. Application Data

(62) Division of application No. 10/853,861, filed on May 25, 2004.

(51) Int. Cl.
*H01L 29/74* (2006.01)
*H01L 29/417* (2006.01)
*H01L 31/111* (2006.01)

(52) U.S. Cl. ............................... 438/648; 438/113

(58) Field of Classification Search ............... 438/648, 438/656, 685, 683, 686, 113, 114
See application file for complete search history.

(56) References Cited

U.S. PATENT DOCUMENTS

| | | | |
|---|---|---|---|
| 3,706,915 A | | 12/1972 | Lootens et al. |
| 4,104,697 A | * | 8/1978 | Kendall et al. ............... 361/305 |
| 4,176,443 A | | 12/1979 | Iannazzi et al. |
| 4,620,215 A | | 10/1986 | Lee |
| 5,021,300 A | | 6/1991 | Stacey |
| 6,028,348 A | * | 2/2000 | Hill ............................. 257/666 |
| 6,582,979 B2 | | 6/2003 | Coccioli et al. |
| 6,774,466 B1 | | 8/2004 | Kajiwara et al. |
| 7,009,215 B2 | * | 3/2006 | D'Evelyn et al. ............. 257/98 |
| 2004/0207081 A1 | * | 10/2004 | Wood et al. .................. 257/734 |

OTHER PUBLICATIONS

"Plastic TO Pacakging Information," National Semiconductor, http://www.national.com/packaging/to.html, Downloaded May 6, 2004, 2 pages.
"Transistor Outline (TO-237)," National Semiconductor, May 1999, 3 Pages.
"Transistor Outline (TO-226)," National Semiconductor, May 1999, 3 Pages.
Co-Pending U.S. Appl. No. 10/861,166, entitled "*Lead Configuration for Inline Packages,*" by Felix C. Li, filed Jun. 3, 2004. (Not enclosed per "*Waiver of the Copy Requirement in 37 CFR 1.98 for Cited Pending U.S. Patent Applications,*" USPTO Office Gazette, Sep. 21, 2004.).

* cited by examiner

*Primary Examiner*—S. V. Clark
(74) *Attorney, Agent, or Firm*—Beyer Weaver LLP

(57) ABSTRACT

An apparatus and method for an enhanced thermally conductive package for high powered semiconductor devices. The package includes a semiconductor die having an active surface and a non-active surface and a metal layer formed on the non-active surface of the die. The package is intended to be mounted onto a metal pad provided on a printed circuit board. A solder is used to affix the metal layer on the non-active surface of the die to the metal pad of the printed circuit board. The interface between the die and the printed circuit board thus includes just three metal layers, including the non-active surface of the die, the solder, and the metal pad on the printed circuit board. The reduced number of metal layers improves heat dissipation and thermal conductivity of the package.

6 Claims, 4 Drawing Sheets

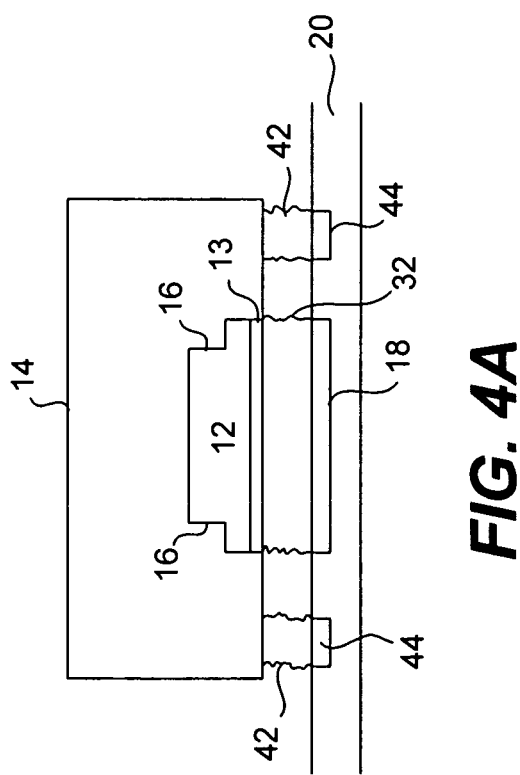
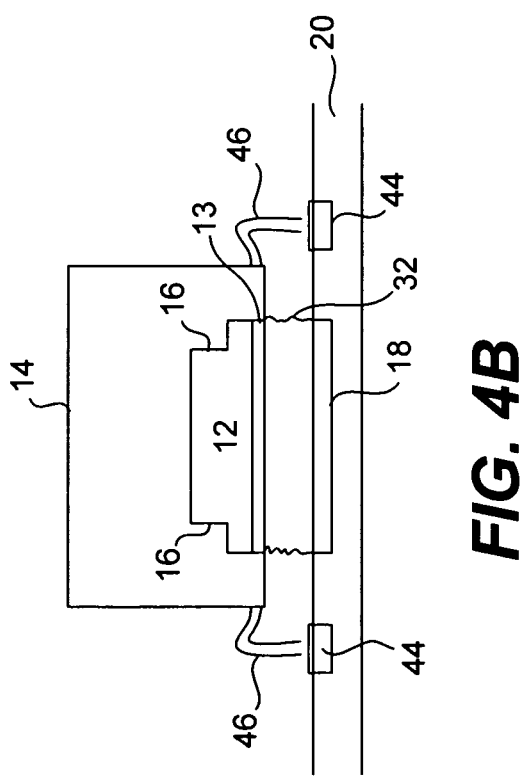
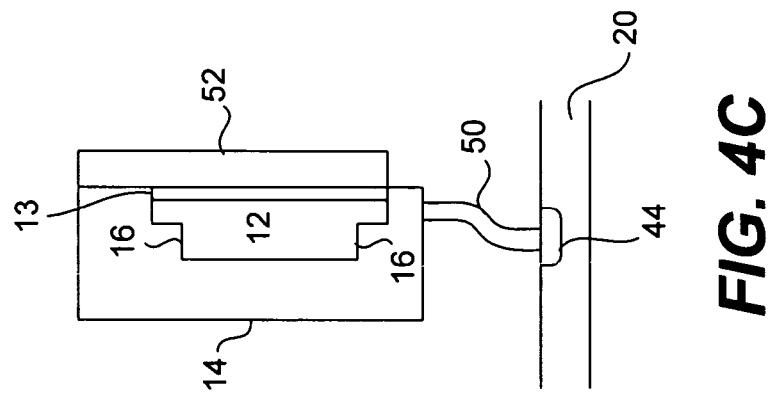

APPARATUS AND METHOD FOR ENHANCED THERMAL CONDUCTIVITY PACKAGES FOR HIGH POWERED SEMICONDUCTOR DEVICES

CROSS REFERENCE TO RELATED APPLICATION

This is a divisional of U.S. applicaation No. 10/853,861, filed May 25, 2004, now U.S. Pat. No. 7,109,587.

FIELD OF THE INVENTION

The present invention relates generally to the fabrication and packaging of semiconductor devices, and more particularly, to an apparatus and method for an enhanced thermally conductive package for high powered semiconductor devices.

BACKGROUND OF THE INVENTION

High power integrated circuits are used in a number of applications, such as power supplies, audio applications, high definition video systems, etc. A wide variety of semiconductor packages can be used for high powered integrated circuits.

Current packaging techniques for high power chips, regardless of the package type, require a large number of semiconductor processing and package manufacturing steps. In a representative manufacturing process, the back surface of the wafer is initially coated with a metal to provide both electrical grounding and thermal conductivity. The metal is usually applied by sputtering either Ti-Nickel (TiNi) or silver and tin (CrAgSn) onto the back side of the wafer. Thereafter, the individual die are singulated by sawing the wafer along the scribe lines. The die attach pad of the lead frame is often plated with silver prior to attaching the die. Eutectic solder is then used to attach the die to the pad. Wire bonding is next performed, followed by encapsulating the die in a molding material, such as epoxy. After the die is encapsulated, the underside of the package and exposed leads are plated with a tin-lead (e.g., 85% Sn 15% Pb) alloy. This layer of metal helps protect the exposed copper of the lead frame from oxidation and is compatible with the solder used to mount the package to a printed circuit board (PCB). The solder used to mount the package to the PCB is usually either a tin-silver-copper combination (e.g., 96% Sn, 3% Ag, 1% Cu) or tin-lead metal layer (e.g., 63% Sn, 37% Pb). The PCB is usually plated with a nickel-Au metal layer in the area where the package is to be mounted and often includes metal vias that thermally couple the nickel-au layer to a thermally conductive plane in the PCB board to provide a heat dissipation path away from the package.

A number of problems are associated with the aforementioned semiconductor processing and package manufacturing sequence. Foremost, a total of six layers of various metals and solders are used, between and including the metal layer sputtered onto the back surface of the wafer and the nickel-au layer on the PCB board. These layers provide a relatively poor thermal-conductive path from the die encapsulated in the package to the PCB. In addition, the use of all these layers complicate the manufacturing process and are expensive to implement.

An apparatus and method for an enhanced thermally conductive package for high powered semiconductor devices is therefore needed.

SUMMARY OF THE INVENTION

To achieve the foregoing, and in accordance with the purpose of the present invention, an apparatus and method for an enhanced thermally conductive package for high powered semiconductor devices is disclosed. The package includes a semiconductor die having an active surface and a non-active surface and a metal layer formed on the non-active surface of the die. The package is intended to be mounted onto a metal pad provided on a printed circuit board. A solder is used to affix the metal layer on the non-active surface of the die to the metal pad of the printed circuit board. The interface between the die and the printed circuit board thus includes just three metal layers, including the non-active surface of the die, the solder, and the metal pad on the printed circuit board. The reduced number of metal layers improves heat dissipation and thermal conductivity of the package.

BRIEF DESCRIPTION OF THE DRAWINGS

The invention, together with further advantages thereof, may best be understood by reference to the following description taken in conjunction with the accompanying drawings in which:

FIGS. 4A-4C are various packages according to the present invention.

In the figures, like reference numbers refer to like components and elements.

DETAILED DESCRIPTION OF THE INVENTION

Figure 1:
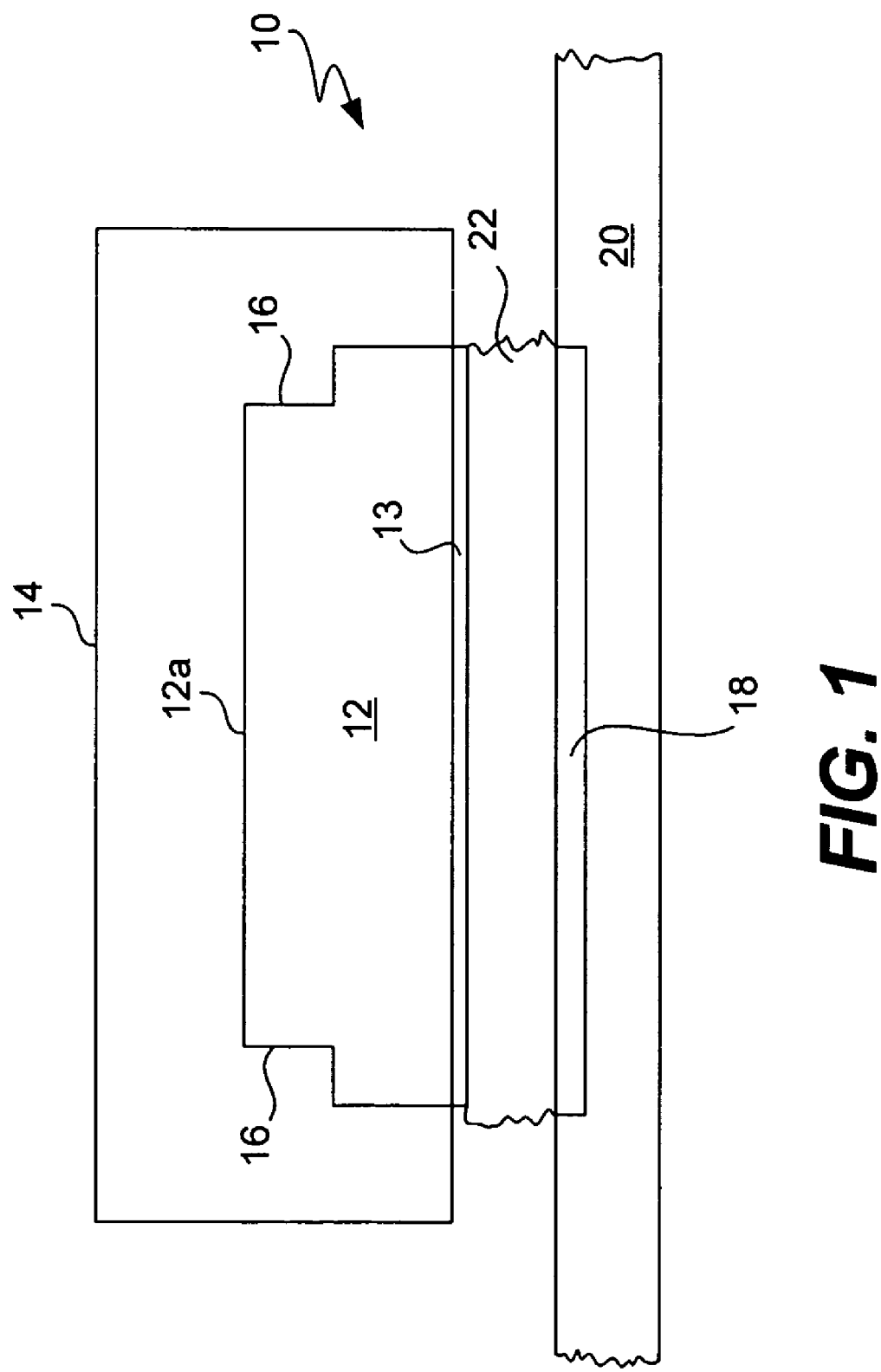
FIG. 1 is a cross section of a semiconductor package mounted onto a printed circuit board according to the present invention.

Referring to FIG. 1, a cross section of a semiconductor package mounted onto a printed circuit board according to the present invention is shown. The package 10 includes a die 12 encapsulated in a molding compound 14. The active surface of the die 12a is facing upward. A metal layer 13 is provided on the bottom surface of the die 12. A notched region 16 is provided around the periphery of the top surface of the die 12. The notched region 16 is filled with the molding compound 14. The die is mounted onto a metal pad 18 on a substrate, such as a printed circuit board 20, with a solder compound 22.

In various embodiments of the invention, the metal layer 13 is provided onto the back surface of the die 12 in wafer form or after the wafer has been singulated. The metal layer can be a variety of metals such tin-nickel (TiNi) or chrome-silver-tin (CrAgSn) for example. The metal pad 18 can also made from any suitable metal or alloy, for example, nickel-gold (NiAu). The solder compound can be a variety of metals, such as tin-lead (63% Sn/37Pb) or tin-silver-copper (96.5Sn3Ago.5Cu) solder.

With the present invention, the number of metal layers between the die 12 and the printed circuit board 20 has been significantly reduced. Specifically, three layers, the metal layer 13, the solder layer 22 and the metal pad 18, are provided at the interface of the die 12 and the printed circuit board 20. In contrast, the prior art packages have six layers of various metals, as described in the background section of the present application. The present invention is thus easier and less expensive to manufacture and provides improved thermal performance.

The notched region 16, filled with molding compound 14, and surrounding the periphery of the die 12, provides improved mechanical properties for the package 10. Specifically, the die in packages without the notch are susceptible to contamination and an increased likelihood of the formation of cracks in the molding compound. The cracks are generally created by thermal expansion caused during operation of the die. When the die is in use, it generates heat, causing the molding compound to expand. When the die is not in use, it cools. Repeated thermal cycles may cause the molding compound to crack over time, thereby allowing moisture and other particulates to contaminate the die. With the present invention, the notches 16 are filled with molding compound 14. The extra molding material makes the package more robust, thus reducing the incidence of cracking and die contamination. The formation of the notched regions 16 on the die 12 is described below with reference to FIGS. 2A through 3.

Figure 2A:
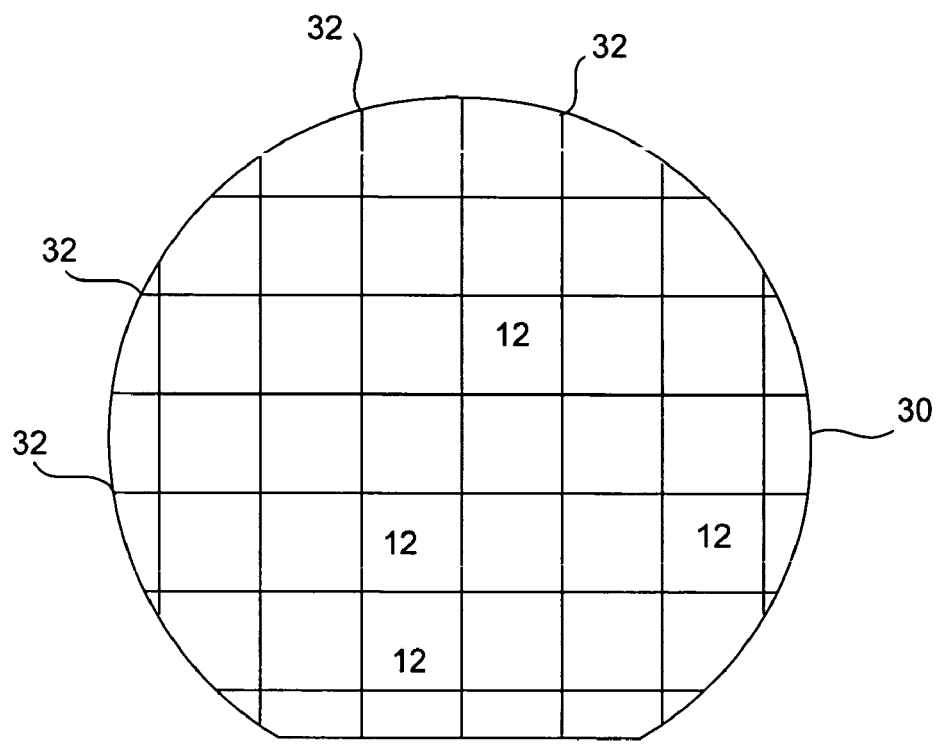
FIG. 2A is a diagram of a semiconductor wafer.

Referring to FIG. 2A, a diagram of semiconductor wafer 30 is shown. The wafer 30 includes a plurality of die 12 fabricated thereon. Horizontal and vertical scribe lines 32 separate each of the die 12 on the wafer 30. After the individual die 12 on the wafer 30 have been fabricated, the individual die 12 are ordinarily singulated by dicing or cutting the wafer along the scribe lines 32. With the present invention, however, the wafer 30 is scribed in two sawing steps to create the notches 16 around the periphery of each die 12.

Figure 2B:
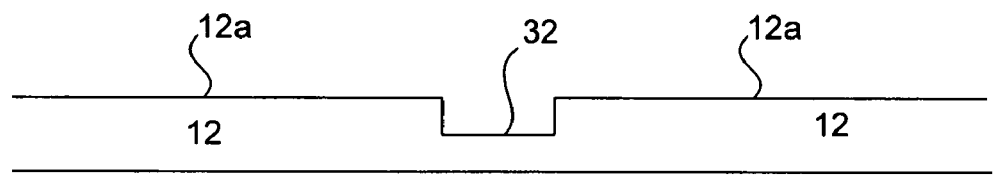
FIG. 2B is a cross section of the semiconductor wafer after a first wafer dicing operation.
Figure 2C:
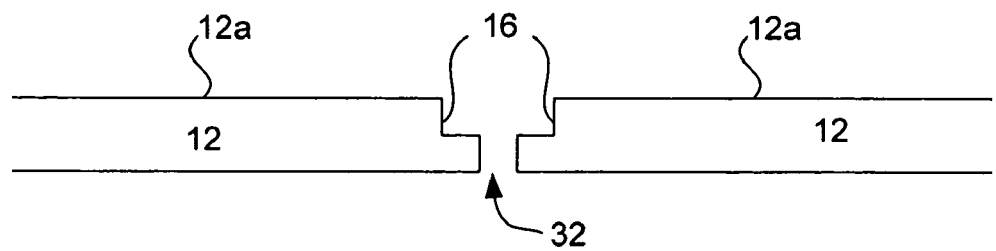
FIG. 2C is a cross section view of the wafer after a second wafer dicing operation.

Referring to FIGS. 2B and 2C, a cross section of the semiconductor wafer 30 in the vicinity of a scribe line 32 is shown. In a first dicing operation as illustrated in FIG. 2B, a shallow, wide cuts are made in the wafer 30 along the scribe lines 32. As best illustrated in FIG. 2B, second narrow cuts are made through the wafer 30 along the scribe lines 32 in a second dicing operation. The resulting structure, as best illustrated in FIG. 2C, are dice 12 with a notched region 16 formed along the periphery of the active surface 12a of each die. The aforementioned two sawing step process is repeated for each scribe line on the wafer 30.

Figure 3:
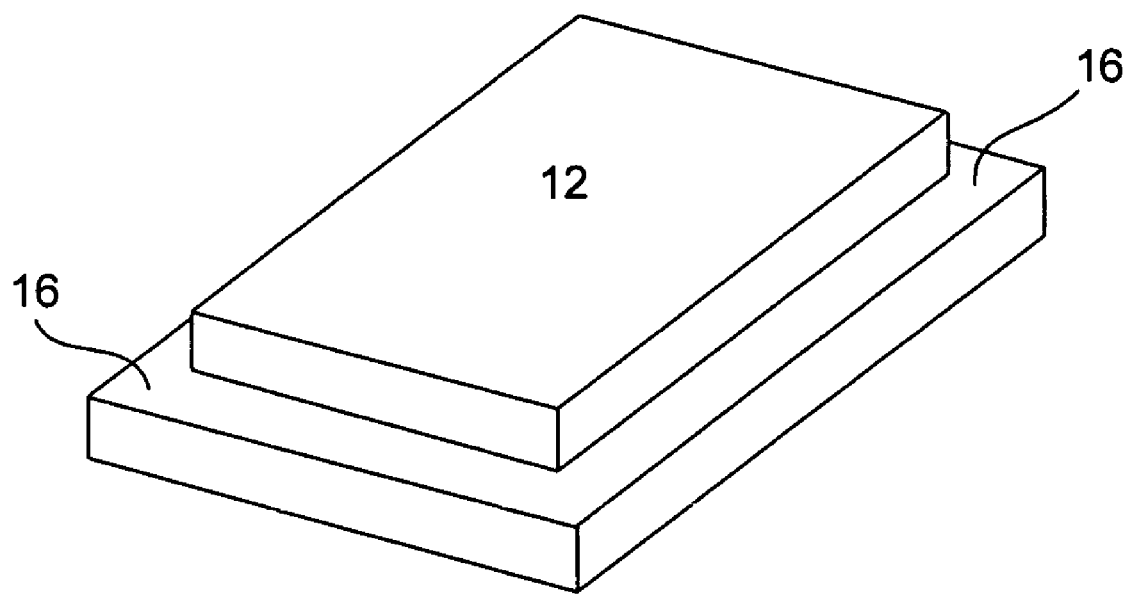
FIG. 3 is a singulated die according to the present invention.

FIG. 3 is a perspective view of the resulting singulated die 12. As is evident in the figure, the notch 16 is formed around the periphery of the die 12. The notched regions are later filled with molding compound during subsequent packaging steps, as previously described above.

The package described herein using the present invention may be used in a variety of different packaging configurations. For example, the present invention may be used in either a leaded or a leadless T0 package configuration. In FIG. 4A for example, a leadless T0 package 12 is shown attached to a printed circuit board 20. The three metal layers, including metal layer 13, the metal pad 18, and the solder 18, are provided at the interface of the die 12 and the printed circuit board 20. Leadless solder contacts 42 provide electrical contacts to metal pads 44 on the board 20. In FIG. 4B, leaded T0 package is shown. This package is similar to that shown in FIG. 4A, except leads 46 are used to electrically couple the die 12 to pads 44 on the board 20. Finally in FIG. 4C, a standard T0 package is shown. In this arrangement, leads 50 are used to electrically couple the die 12 to the board 20. A heat sink 52 is affixed to the metal layer 13 of the die 12. For more information on the various T0 package configurations, see http://www.national.com/packaging/to.html, incorporated by reference herein for all purposes.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. A method comprising:
   fabricating a plurality of die on a semiconductor wafer;
   applying a single metal layer onto the back surface of the semiconductor wafer, the metal layer consisting of either TiNi or CrAgSn
   singulating the individual die on the wafer; and
   affixing the singulated die to a metal pad on a printed circuit board using a solder to secure the metal layer on the singulated die to the metal pad, whereby the single metal layer applied onto the back surface of the semiconductor wafer, the solder, and the metal pad alone form the interface between the die and the printed circuit board.

2. The method of claim 1, wherein the pad on the printed circuit board is NiAu.

3. The method of claim 1, wherein the solder is either SnPb or SnAgCu.

4. A method comprising:
   fabricating a plurality of die on a semiconductor wafer;
   applying a metal layer onto the back surface of the semiconductor wafer, the metal layer consisting of either TiNi or CrAgSn
   singulating the individual die on the wafer wherein singulating the individual die on the wafer further includes performing a first dicing operation along scribe lines of the wafer and performing a second dicing operation along the scribe lines of the wafer, whereby the first dicing operation is relatively shallow and wide compared to the second dicing operation and the second dicing operation is narrow and deep compared to the first dicing operation; and
   affixing the singulated die to a metal pad on a printed circuit board using a solder, whereby the metal layer applied onto the back surface of the semiconductor wafer, the solder, and the metal pad form the interface between the die and the printed circuit board.

5. The method of claim 1, wherein singulating the individual die on the wafer results in a notch being formed around the periphery of the individual die.

6. The method of claim 1, further comprising encapsulating the individual die in a molding compound.

* * * * *